(12) United States Patent
Das et al.

(10) Patent No.: US 11,840,756 B2
(45) Date of Patent: Dec. 12, 2023

(54) BINARY AG—CU AMORPHOUS THIN-FILMS FOR ELECTRONIC APPLICATIONS

(71) Applicant: University of North Texas, Denton, TX (US)

(72) Inventors: Santanu Das, Benares (IN); Sundeep Mukherjee, Highland Village, TX (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 660 days.

(21) Appl. No.: 17/066,670

(22) Filed: Oct. 9, 2020

(65) Prior Publication Data

US 2021/0025051 A1    Jan. 28, 2021

Related U.S. Application Data

(62) Division of application No. 15/676,189, filed on Aug. 14, 2017, now Pat. No. 10,822,692.

(60) Provisional application No. 62/374,209, filed on Aug. 12, 2016.

(51) Int. Cl.
| | |
|---|---|
| *H01L 23/52* | (2006.01) |
| *C23C 14/35* | (2006.01) |
| *C23C 14/54* | (2006.01) |
| *C22C 5/08* | (2006.01) |
| *C23C 14/18* | (2006.01) |
| *C23C 14/14* | (2006.01) |
| *C23C 14/08* | (2006.01) |
| *H01L 27/01* | (2006.01) |

(52) U.S. Cl.
CPC .............. *C23C 14/35* (2013.01); *C22C 5/08* (2013.01); *C23C 14/087* (2013.01); *C23C 14/14* (2013.01); *C23C 14/185* (2013.01); *C23C 14/542* (2013.01); *H01L 23/52* (2013.01); *H01L 27/016* (2013.01)

(58) Field of Classification Search
CPC ....... C23C 14/35; C23C 14/087; C23C 14/14; C23C 14/185; C23C 14/542; C22C 5/08; H01L 23/52; H01L 27/016
See application file for complete search history.

(56) References Cited

U.S. PATENT DOCUMENTS

| | | |
|---|---|---|
| 6,107,116 A | 8/2000 | Kariya et al. |
| 2004/0061233 A1 | 4/2004 | Matsubara et al. |
| 2005/0269662 A1 | 12/2005 | Ishitsuka et al. |
| 2011/0220903 A1 | 9/2011 | Tauchi et al. |
| 2016/0276561 A1 | 9/2016 | Maki |

(Continued)

OTHER PUBLICATIONS

Chawla, et al. "Electron scattering at surfaces and grain boundaries in Cu thin films and wires." Physical Review B 84.23 (Dec. 2011): 235423.

(Continued)

*Primary Examiner* — Jerome Leboeuf
(74) *Attorney, Agent, or Firm* — Daniel J. Chalker; Edwin S. Flores; Chalker Flores, LLP

(57) ABSTRACT

An interconnect and a method of making an interconnect between one or more features on a substrate comprises: sputtering a noble metal-copper eutectic thin film under controlled power on an oxide grown or deposited on a substrate; and forming an amorphous alloy structure from the noble metal-copper eutectic thin film in the shape of the interconnect and the interconnect comprising no grain or grain boundaries without temperature sensitive resistivity.

20 Claims, 4 Drawing Sheets

(56) References Cited

U.S. PATENT DOCUMENTS

2018/0044782 A1      2/2018    Mukherjee et al.

OTHER PUBLICATIONS

Das, et al. "Enhanced electrical performance of Ag—Cu thin films after low temperature microwave processing." Journal of Vacuum Science & Technology B, Nanotechnology and Microelectronics: Materials, Processing, Measurement, and Phenomena 31.1 (Jan. 2013): 011204.

Fufime, Satoru. "On an Amorphous Ag—Cu Alloy Film." Japanese Journal of Applied Physics 5.7 (Jul. 1966): 643.

Homma, Tetsuya. "Low dielectric constant materials and methods for interlayer dielectric films in ultralarge-scale integrated circuit multilevel interconnections." Materials Science and Engineering: R: Reports 23.6 (Jan. 1998): 243-285.

Homoth, et al. "Electronic transport on the nanoscale: ballistic transmission and Ohm's law." Nano letters 9.4 (Mar. 2009): 1588-1592.

Hüfner, et al. "X-Ray photoelectron spectra of the valence bands of some transition metals and alloys." Physical Review B 8.10 (Nov. 1973): 4511.

Kim, et al. "Large discrete resistance jump at grain boundary in copper nanowire." Nano letters 10.8 (Jul. 2010): 3096-3100.

Lee, et al. "Fabrication of high-quality single-crystal Cu thin films using radio-frequency sputtering." Scientific reports 4 (2014).

Li, et al. "Reliability challenges for copper interconnects." Microelectronics Reliability 44.3 ( Mar. 2004): 365-380.

Misra, et al. "Effect of alloying and cladding on the failure of silver metallization under high temperature and current stressing." Applied Physics Letters 87.17 (Oct. 2005): 172111.

Moulder, et al. "Handbook of X-ray photoelectron spectroscopy." Perkin-Elmer, Eden Prairie, MN 52 (1992).

Oelhafen, et al. "New type of d-band-metal alloys: the valence-band structure of the metallic glasses Pd—Zr and Cu—Zr." Physical Review Letters 43.15 (Oct. 1979): 1134.

Ogawa, et al. "Electromigration reliability issues in dual-damascene Cu interconnections." IEEE Transactions on reliability 51.4 (Dec. 2002): 403-419.

Ushida, et al. "XPS Valence Band and Core Level Spectra of Sputter-Deposited Fe—Cu, Fe—Ag and Fe—Cu—Ag Alloy Films." Journal of the Physical Society of Japan 58.5 (May 1989): 1725-1734.

Yang, et al. "Humidity effect on nanoscale electrochemistry in solid silver ion conductors and the dual nature of its locality." Nano letters 15.2 (Jan. 2015): 1062-1069.

(a): Polycrystalline Cu thin Films (b): Cu-Ag Metallic Glass thin Films

No Grain Boundaries

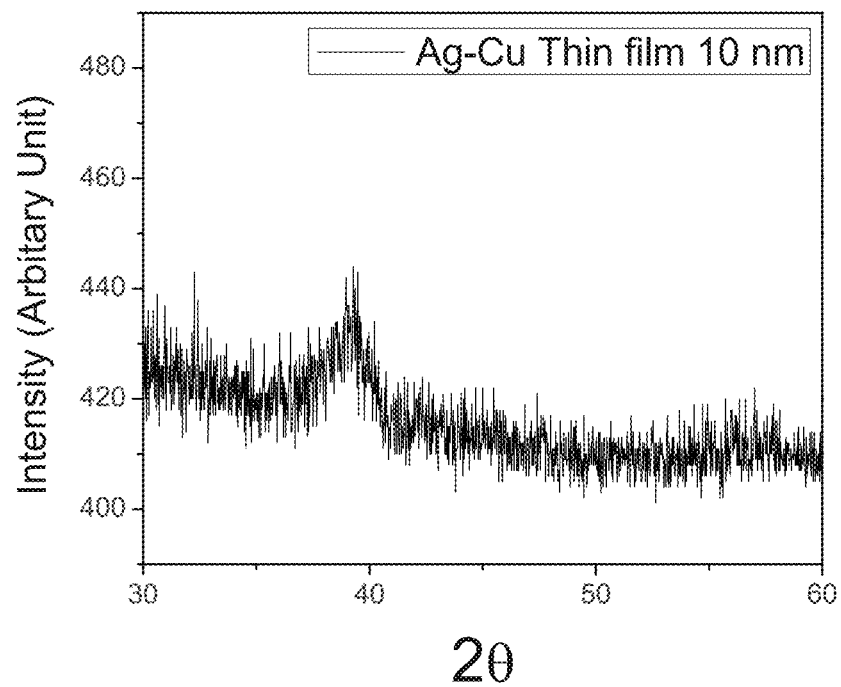
FIG. 3
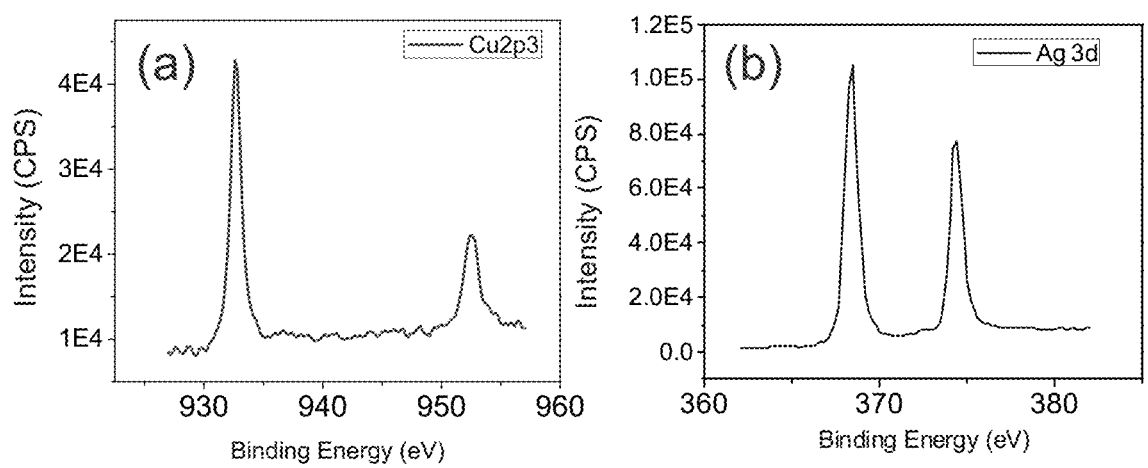
FIG. 4A          FIG. 4B

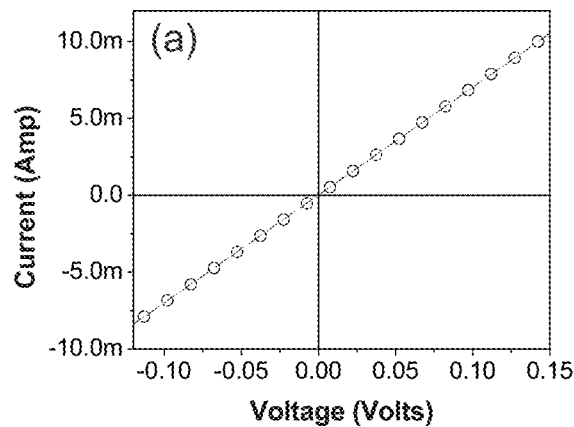 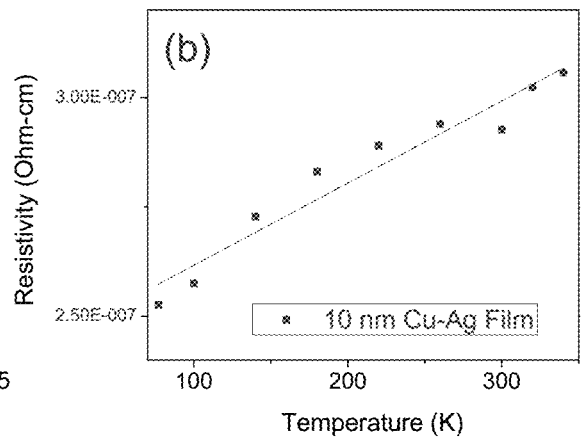
FIG. 5A  FIG. 5B
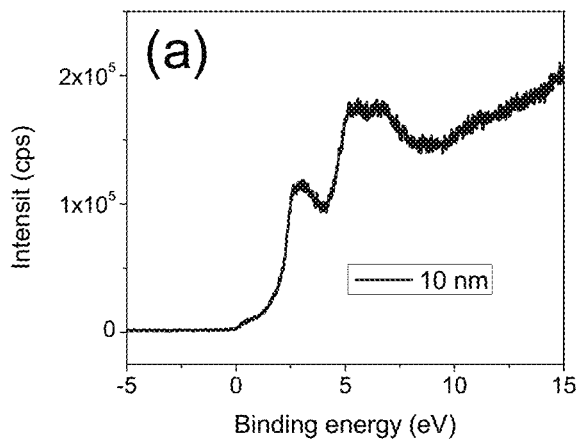 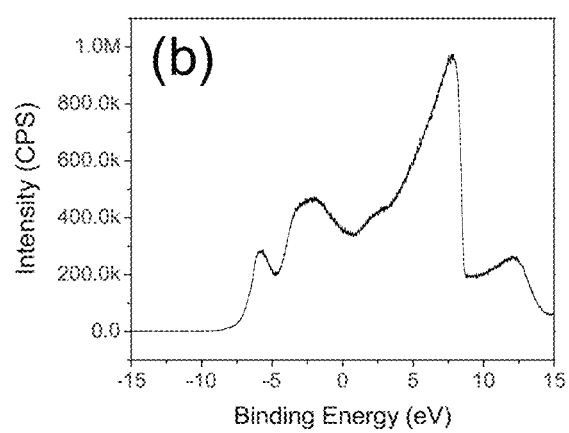
FIG. 6A  FIG. 6B

BINARY AG—CU AMORPHOUS THIN-FILMS FOR ELECTRONIC APPLICATIONS

CROSS-REFERENCE TO RELATED APPLICATIONS

This patent application claims priority to and is a divisional patent application of U.S. patent application Ser. No. 15/676,189 filed Aug. 14, 2017, which claims priority to U.S. Provisional Patent Application Ser. No. 62/374,209 filed on Aug. 12, 2016. The entire contents of these patent applications are incorporated herein by reference.

STATEMENT OF FEDERALLY FUNDED RESEARCH

None.

TECHNICAL FIELD OF THE INVENTION

The present invention relates in general to the field of interconnects, and more particularly, to interconnect lines in semiconductor devices.

BACKGROUND OF THE INVENTION

Without limiting the scope of the invention, its background is described in connection with metallic thin film materials.

Recently, low resistive, highly durable metallic thin film materials are under vigorous search in order to develop the sub-20 nm scale interconnects for integrated circuits (ICs) and electrode development [1]. The sharp rise in resistivity in conventional metallic thin films (i.e. Cu, Al) with the scaling down of interconnect width in ICs has become a key challenge for the semiconductor industry [2]. This abrupt lowering of electrical properties are due to the presence of grain and grain boundaries and surface scattering in polycrystalline thin films below sub-20 nm scale. Electron scattering at the grain boundaries also generates unusual heat, which reduces the lifetime of interconnects and affect their reliability [1,3,4]. Therefore, obtaining a thin/conformal diffusion barrier has become increasingly difficult in narrow metallic trench lines. Similarly, when feature size of the nano-scale conductors shrink, the electro-migration (i.e. flow of materials and segregation owing to the high current density) effect dominates, thus, diminishes the durability and the reliability of devices [5]. Although, carbon nanotubes and graphene have been explored as potential candidates for future interconnect materials, the significant challenges are to integrate them with existing silicon technology.

Noble metals and their alloys exhibit low resistivity, high thermal conductivity, good adhesion and good electro-migration resistance. Among them, silver (Ag) is one of the materials exhibit lowest resistivity with very high electro-migration resistance owing to its higher Z value [6]. On the other hand, Cu is widely used to interconnect materials in semiconductor industry due to its high electrical and thermal conductivity and low cost. However, Cu based nanoscale interconnects exhibit serious reliability issues, thus, limits its application below sub-20 nm scale owing to its low electro-migration resistance [7].

Recently, it has been shown that microwave processed Ag—Cu polycrystalline thin film exhibits the lowest resistivity and good electro-migration resistance [5]. Mishra et. al demonstrate the addition of Al in Ag could possibly improve the electro-migration resistance of the Ag, which further helps in large-scale integration of the circuitry [8]. However, all these proposed techniques are based on the polycrystalline thin films where major electron transport is inhibited by the defect-planes, such as, grain-boundaries (GBs) and barrier interfaces (BIs).

When the dimension of the metals/alloys interconnect fall below the mean-free path of the electron the increase in resistivity only occurs due to the defect scattering. Few recent reports reveal that the GBs itself in nano-scale exhibit extremely high resistivity, which suppress the electron conduction by several order of magnitude [4,9]. In addition, it has been shown that the addition of Cu in single crystal Ag enhances the electrical conductivity of Ag single crystal thin film [10]. Nevertheless, the employment of nanoscale single crystal conductor has so far proven unrealistic.

SUMMARY OF THE INVENTION

In one embodiment, the present invention includes a method of making an interconnect between one or more features on a substrate comprising: growing or depositing a thermal oxide on a substrate; sputtering a noble metal-copper metallic glass thin film under controlled power on the thermal oxide; and forming the noble metal-copper metallic glass thin film into the interconnect. In one aspect, the noble metal is selected from at least one of ruthenium, rhodium, palladium, silver, osmium, iridium, platinum, or gold. In another aspect, the sputtering step further comprises using a temperature gradient assist. In another aspect, the noble metal-copper metallic glass thin film is a eutectic that comprises between 20, 30, 40, 50, 60, and 70 atomic % (at %) noble metal and the remainder Cu. In another aspect, the noble metal-copper metallic glass thin film is a eutectic that comprises between 20, 30, 40, 50, 60, and 70 at % Cu and the remainder the noble metal. In another aspect, the deposition rate of the sputtering step is 0.5, 0.6, 0.7, 0.8, 0.9, 1.0, 1.1, 1.2, 1.3, 1.4, 1.5, 1.6, 1.7, 1.8, 1.9, or 2.0 Å/s. In another aspect, the controlled power is defined further as a low power sputtering at about 20, 30, 40, 50, 60, 70, 80 or 90 watts. In another aspect, the controlled power is a low power sputtering using a DC magnetron. In another aspect, a base pressure and a deposition pressure during the sputtering step is between ~10-7 Torr and ~10-3 Torr. In another aspect, a temperature of the substrate temperature is maintained at about 12, 13, 14, 15, 16, 17, 18, 19, 20, 21, 22, 23, 24, or 25° C. In another aspect, the substrate is a silicon substrate. In another aspect, the interconnect shows little to no change in resistivity in a temperature range of 77K to 340K. In another aspect, a resistivity of the Au or Ag-copper eutectic thin film is generally independent of temperature.

Another embodiment of the present invention includes a method of making an interconnect between one or more features on a substrate comprising: sputtering an Au or Ag-copper eutectic thin film under controlled power on an oxide grown or deposited on a substrate; and forming an amorphous alloy structure from the Au or Ag-copper eutectic thin film in the shape of the interconnect and the interconnect comprising no grain or grain boundaries without temperature sensitive resistivity. In one aspect, a resistivity of the Au or Ag-copper eutectic thin film is generally independent of temperature.

Yet another embodiment of the present invention includes an integrated circuit interconnect on a substrate comprising: an amorphous metallic alloy thin eutectic film disposed on the substrate, wherein the metallic alloy comprises a noble metal-copper thin film and is homogenous with no polycrystalline heterogeneity. In one aspect, the noble metal is selected from at least one of ruthenium, rhodium, palladium, silver, osmium, iridium, platinum, or gold. In another aspect, the sputtering step further comprises using a temperature gradient assist. In another aspect, the noble metal-copper metallic glass thin film is a eutectic that comprises between 20, 30, 40, 50, 60, and 70 at % noble metal and the remainder Cu. In another aspect, the noble metal-copper metallic glass thin film is a eutectic that comprises between 20, 30, 40, 50, 60, and 70 at % Cu and the remainder the noble metal. In another aspect, the interconnect is formed with a deposition rate of 0.5, 0.6, 0.7, 0.8, 0.9, 1.0, 1.1, 1.2, 1.3, 1.4, 1.5, 1.6, 1.7, 1.8, 1.9, or 2.0 Å/s. In another aspect, the interconnect is formed by a low power sputtering at about 20, 30, 40, 50, 60, 70, 80 or 90 watts. In another aspect, the interconnect is formed by sputtering with a DC magnetron. In another aspect, the interconnect is formed with a base pressure and a deposition pressure of between ~10-7 Torr and ~10-3 Torr during sputtering. In another aspect, a temperature of the substrate temperature is maintained at about 12, 13, 14, 15, 16, 17, 18, 19, 20, 21, 22, 23, 24, or 25° C. In another aspect, the substrate is a silicon substrate. In another aspect, the interconnect shows little to no change in resistivity in a temperature range of 77K to 340K. In another aspect, a resistivity of the Au or Ag-copper eutectic thin film is generally independent of temperature. In another aspect, the interconnect comprises at least one of: a high surface tension and an anatomically smooth surface or small line edge roughness, produces a uniform electric field across the interconnect, comprises no grain, and/or comprises no grain boundaries.

BRIEF DESCRIPTION OF THE DRAWINGS

For a more complete understanding of the features and advantages of the present invention, reference is now made to the detailed description of the invention along with the accompanying figures and in which:

in FIG. 1A the state-of-the-art metallic polycrystalline Cu thin films with grain-boundary and electron scattering; and in FIG. 1B the microstructure of Ag—Cu metallic glass thin film with a grain boundary free structure of the present invention.

FIG. 3 is a graph of low angle XRD pattern showing the amorphous structure of the 10 nm Ag—Cu thin-films.

FIGS. 4A and 4B show graphs of X-ray Photo electron spectroscopy of Ag—Cu thin film showing characteristic Cu2p3 (FIG. 4A) and Ag3d (FIG. 4B) peaks.

FIG. 5A is a graph that shows the current-voltage characteristics of 10 nm Ag—Cu thin films showing the metallic behavior of the film; and FIG. 5B is a graph that shows the temperature dependent resistivity of the 10 nm Ag—Cu thin film.

FIGS. 6A and 6B are graphs of ultraviolet photo-emission (UPS) spectra of 10 nm Ag—Cu metallic glass thin films showing (FIG. 6A) valance band at He—I excitation (21.2 EV); and (FIG. 6B) the secondary electron cutoff of the thin film.

DETAILED DESCRIPTION OF THE INVENTION

Figure 1A:
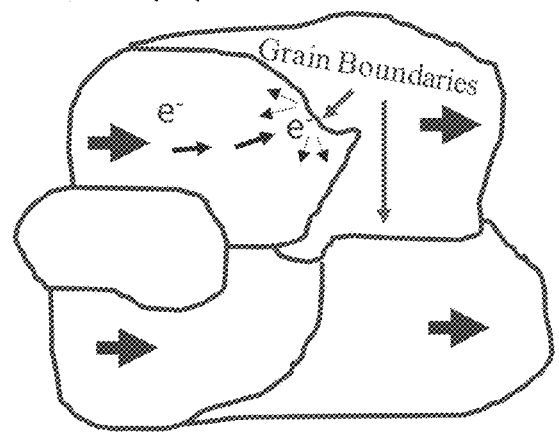
FIGS. 1A and 1B are schematics showing.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

There is a sharp increase in resistivity of metallic thin films with the reduction of film thickness. This is attributed to increased grain boundary and surface scattering in polycrystalline metallic thin films. The present inventors have synthesized a noble metal-copper (e.g., a Ag—Cu (composition close to 60 at % Ag-40 at % Cu)) thin film that is fully amorphous by DC magnetron sputtering. The metallic thin films of the present invention show extraordinarily high conductivity, very small temperature dependence of resistivity, and have the potential of replacing crystalline metals in several thin-film electronic applications, including deeply scaled interconnects large-scale integrated circuits. The amorphous metallic alloy thin films of the present invention can be used in a number of integrated circuit features as an interconnect and/or as a wire. For example, the invention may find particular uses for: low dimension high conducting films for micro-electro-mechanical systems (MEMS); highly conductive thin films; and/or as an excellent material for giant magneto-resistance. The invention can also be used to overcome a variety of technological challenges, including: the exponential increase in resistivity of low dimensional thin films for semiconductor field effect transistor devices; as a low loss conductor for electrical switching applications; in devices requiring high electrical conductivity with low heat generation; and/or to overcome voltage drop issues in field-emission devices due to heterogeneous interfaces.

What is needed are new devices and methods that provide ultra-low resistivity, good thermal conductivity, low electromigration, and excellent adhesion with the substrate. The present inventors have developed amorphous metallic alloy thin films that overcome many of the issues associated with poly-crystalline metallic thin films. The reasons for choosing a metallic glassy system include: (i) homogeneous short-range structure with no poly-crystalline heterogeneity, (ii) GBs and BIs free structure, (iii) extraordinarily mechanical strength (young modulus, hardness, and friction properties), and (iv) high corrosion/erosion resistance. More specifically, metallic-glasses have high quality factor because of low internal friction in amorphous structure and absence of dislocation based energy dissipation. Due to these unique characteristics, metallic glasses thin film are one of the potentially transformative future materials in interconnects and nano-scale electrode applications. Since inert nature of surface structure, metallic glasses could be unique as it prevail the effect of successive changes in the ambience, which is indeed rare in the other nano-scale conductors [11]. In this context, binary amorphous alloy structure are attractive due to the following reasons: (i) homogeneous metalloid-free structure (ii) alloy composition is ICs fabrication compatible [12], and (iii) GB/BI free isotropic structure contain lower scattering points. In one non-limiting example, the present inventors show making a Ag—Cu binary eutectic (60.12 atomic % (at %) Ag—39.88 at % Cu) alloy is one of the potential material where Ag and Cu both exhibit lowest resistivity and integrated circuit (IC) fabrication compatible. The inventors demonstrate herein the formation of amorphous sub-20 nm Ag—Cu alloy thin film with high electrical conductivity. The present invention shows that the electrical conductivity of Ag—Cu alloy belongs to the level between pure Ag and pure Cu and is independent of temperature. The homogeneous isotropic structure with high conductivity is further explained using their valance band study in ultra-violet photoemission spectroscopy (UPS).

Figure 1B:
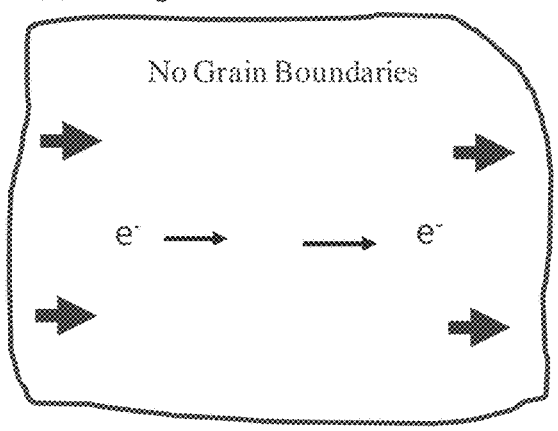

Metallic-glasses (MG) overcome many of the problems associated with poly-crystalline copper. FIG. 1A shows a state-of-the-art metallic polycrystalline Cu thin films, however these metallic polycrystalline Cu thin films include significant grain-boundary and electron scattering. FIG. 1B shows the microstructure of Ag—Cu metallic glass thin film with a grain boundary free structure of the present invention. As the schematic in FIG. 1B shows (and the images of FIGS. 2A and 2B), there are no grain boundary scattering losses in metallic-glasses of the present invention due to their amorphous nature because they are homogeneous and isotropic down to atomic scale.

The present inventors deposited an Ag—Cu thin film using low power DC magnetron sputtering of thickness 10 nm±2.5 nm on a ultra-clean thermal oxide coated Si substrate. The deposition power was kept at ~50 watts in order to control the deposition rate (~1.33 Å/s) and the substrate temperature was maintained ~16° C. The low power and slow deposition rate along with a sufficient temperature gradient assists in formation of the amorphous alloy structure from the Ag—Cu eutectic composition (60.12 at % Ag—39.88 at % Cu). Similarly, a 99.999% pure Ag and Cu thin film was deposited in a similar fashion in order to achieve a comparative study. The base pressure and the deposition pressure of the sputtering unit were kept at ~$10^{-7}$ Torr and $10^{-3}$ Torr, respectively.

Figure 2A:
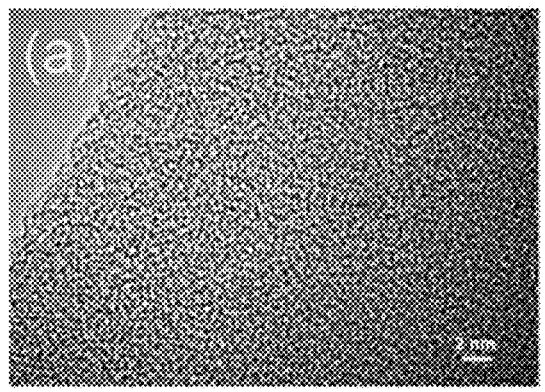
FIGS. 2A and 2B show high-resolution transmission electron micrograph (HRTEM) and shows the complete amorphous structure of the thin film (No grain and grain boundaries are found in the microstructure). Selected area diffraction (SAD) pattern (inset of FIG. 2B) shows the diffuse structure, which is a stereotypical characteristic of amorphous materials.
Figure 2B:
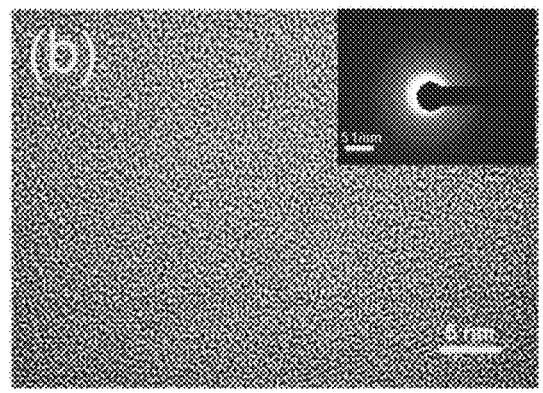

FIG. 2A shows the high resolution transmission electron microscopy (HRTEM) image of the 10 nm thin film demonstrating the complete amorphous structure with no grain and grain boundaries. A clear absence of grain and grain-boundaries in the nano-structure validates the successful deposition of Ag—Cu amorphous thin film on the ambient condition. FIG. 2B shows the defect structure of the film using the selected area diffraction (SAD) pattern taken inside of the TEM. The SAD pattern shows the diffuse electron diffraction pattern, which further manifest the complete amorphous nature of the Cu—Ag thin film.

FIG. 3 demonstrates the small angle XRD pattern collected inside of X-ray diffraction instrument (Bruker, USA) from angle 20° to 66°. The pattern demonstrates the stereo-typical broad hump representation of the amorphous structure of the Cu—Ag thin film. The x-ray photoelectron spectroscopy (XPS) was performed using a PHI 5000 Versaprobe x-ray photoelectron spectrometer in order to investigate the surface characteristics/surface composition of the as deposited thin film.

FIG. 4A and FIG. 4B show the characteristic Ag $3d_{5/2}$ and Cu $2p_{3/2}$ peak positions at 932.48 eV and 368.31 eV, respectively [13]. The surface composition of the film was calculated after correcting the baseline of the XPS peak, optimizing the peak area, and fitting of those Cu and Ag peaks using the Multipack software inbuilt with the spectrophotometer instrument. A surface composition of Ag 60.1 at %-Cu 39.7% was obtained, and others <0.2% of the amorphous thin film, which is very close to the targeted composition of the material to be achieved. Thus, the measure the surface homogeneity of Cu—Ag thin film was obtained, which was further confirmed after the data recorded in the multiple areas of the thin film. After analyzing all the data we observe the following: (1) All the characteristic peaks of Cu ($2p_{3/2}$) and Silver ($3d_{5/2}$) is same (shape, full-width half maxima FWHM, peak area, intensity, etc.) at different surface positions; (2) there were small shift found in some of the peak positions; and (3) The surface composition of the film was found almost close to the composition of our staring material. The tiny shift in peak positions of Cu and Ag is likely due to the stress developed in the amorphous alloy film during sputtering.

The room temperature electrical properties of the thin films were measured using a Hall measurement system (Ecopia HMS 5000) and the resistivity and the conductivity values are calculated by averaging the twenty (20) data points measured under exactly same condition. The room temperature (298K±2K) resistivity and the conductivity values of the amorphous Ag—Cu thin film was found to be $2.97 \times 10^{6} \pm 4.92 \times 10^{-9}$ (Ohm-cm) and $3.49 \times 10^{5} \pm 5584.52$ (Ohm-cm)$^{-1}$, respectively. The room temperature resistivity of 99.999% Ag and 99.999% Cu thin film shows $1.29 \times 10^{-6} \pm 5.54 \times 10^{-9}$ and $2.05 \times 10^{-5} \pm 7.39 \times 10^{-7}$ Ohm-cm, respectively. This observation depicts that the resistivity of Ag—Cu thin film exhibit in between the resistivity of pure Ag and pure Cu. The temperature was kept constant by using an inbuilt heater system with the substrate holder, which can be able to control the temperature fluctuation of ±0.1° C. Similarly, the electrical properties as a function of temperature was also measured using the same system from 77 K (−196° C.) to 340 K (67° C.) for each of the thin films as shown in FIG. 5A and FIG. 5B.

FIG. 5A shows the plot of resistivity as a function of temperature for 99.999% Ag, 99.999% Cu and 99.999% Ag—Cu amorphous alloy thin films. For pure Ag and pure Cu thin film the inventors found a substantial changes in resistivity, which are few orders of magnitude. However, no order change is observed for the resistivity for Ag—Cu thin film during the entire temperature range from 77 K (−196° C.) to 340 K (67° C.) and the total change in resistivity was found <17% (or 0.68 Ohm-cm) due to the change in temperature from 77 K (−196° C.) to 340 K (67° C.). These further suggest a weak temperature dependence of resistivity for amorphous Ag—Cu alloy thin film, whereas pure polycrystalline Ag and Cu exhibit strong temperature dependence of resistivity as shown in FIG. 5B. FIG. 5B shows a comparative log-log plot of resistivity vs temperature for all the three thin films altogether and the slope of the curve depicts the change in resistivity due to the thermal vibration. Although the thermal vibrations are active for polycrystalline thin films, however, the effect of temperature is minimal or almost negligible for the amorphous thin film.

The valance band study and work-function of all the thin film samples were carried out by ultraviolet photo-electron spectroscopy (UPS) inbuilt with a PHI 5000 Versaprobe UPS/XPS spectrometer using He—I$\alpha$=21.22 eV UV light, which was used to probe the valence band structure as well. The Work Function of the film is calculated according to the equation: $\Phi=h\nu-\Delta E$ and found to be 4.2 eV for 10 nm Ag—Cu amorphous alloy thin film. FIG. 6A and FIG. 6B show the valence band structure of the 99.999% Ag, 99.999% Cu and 99.999% Ag—Cu amorphous thin film, respectively, at He-I$\alpha$ (21.2 eV) excitation. All the spectra are combined and plotted together in order to identify the electronic structure and density of states (DOS) of the amorphous alloy, which is coming from the elemental contribution of the each elements (as shown in FIG. 6A). FIG. 6A shows the broad UPS-valence band peaks for both 99.999% Cu (Electron configuration: [Ar] $3d^{10}$ $4s^1$) and 99.999% Ag (Electron configuration: [Kr] $4d^{10}$ $5s^1$). The position and FWHM of the Cu and Ag peak indicate their effective density of state (DOS) of the Cu-3d band and Ag-4d band, respectively [14]. Similarly, the Ag—Cu amorphous alloy also exhibit the signature of both the d-bands of Cu and Ag in their respective position. The DOS of Ag—Cu alloy can be identified as a composite valance structure (the curve in FIG. 6A) of their individual d-bands as clearly indicated in FIG. 6A. Thus, this further demonstrates that the valance band structure of the amorphous alloy is consists of the elemental DOS of the individual components [15]. However, both the elemental Cu and Ag d-bands became broader (increase of their FWHM) after these two elements form an amorphous alloy of Ag—Cu compared to their respective pure elemental forms [16]. The broader d-band peaks reflect the overlapping exchange interaction between two distinct elements (e.g. Ag and Cu in this case), which essentially suggest the homogeneous formation of Ag—Cu bonds compared to the Ag—Ag and Cu—Cu bonds (One Ag atom has more Cu atoms as nearest neighbor rather Ag atoms and vice-versa) [17]. This causes the widening of d band DOS in the alloy compared to their individual d-band, which is comparatively narrower. Hence, this homogeneous mixture creates a discrete conduction level in the conduction band of alloy, which improves the conductivity of the 10 nm amorphous film.

Thus, the present invention includes, at least: (1) making a fully amorphous film of the composition Cu—Ag (composition close to 60 at % Ag-40 at % Cu) has never been reported before; (2) making a fully amorphous film by keeping the surface composition of Cu—Ag (composition close to 60 at % Ag-40 at % Cu); (3) the deposition of amorphous thin films on $SiO_2$/Si substrate; (4) the deposition of amorphous thin films on $SiO_2$/Si substrate with different thickness by controlling power; (5) thickness optimization of the amorphous thin film by controlling the deposition time; (6) the electrical resistivity of the thin films is in the order of $\sim 10^{-7}$ Ohm-cm; (7) the valence band structure of the thin films; (8) the temperature dependence of the thin film is almost negligible; and/or (9) the Magneto-resistance of the thin film is in the order of $\sim 10^3$ Ohm.

While potentially less desirable, the following may be substituted for the sputtering step: rapid cooling of bulk materials of the same composition; and/or fabrication of a thin wire <10 nm.

The following features and properties of invention demonstrate its improvement over prior methods or features: The improved features include: (a) the composition of the thin film; (b) the amorphous, grain, and grain-boundary free structure; and/or (c) the extraordinary electrical and mechanical properties.

Some of the improved properties include: high electrical conductivity, low electrical resistivity, high magneto-resistance, low temperature dependence of resistivity/conductivity, low temperature dependence of magneto-resistance, good mechanical properties, good thermal properties, good corrosion resistance, and good ambient oxidation resistance.

In one specific non-limiting example, the present invention includes one or more of the following features or steps: a composition close to Cu: 40 atomic %; Ag: 60 atomic %, a rate of sputtering deposition: 1.43 Å/s, a vacuum chamber pressure (Base Pressure): 5×10-8 Torr, a deposition pressure: 15.8 mT (±1 mT), an applied power: 50 W, under a noble-gas, e.g., Argon.

Another improvement of the present invention overcomes the problem caused when a metal conductor scales down to less than about 20 nanometers, in which the resistivity increases dramatically due to grain boundary and surface scattering. Similarly, when temperature changes, the resistivity of those existing conductor materials also changes rapidly, resulting in unusual current flow, reliability issues, and the failure of the devices. The thin film of the present invention has a very low resistivity at the 10 nm scale. In addition, the temperature dependent resistivity of this new material is almost negligible in the temperature range of 77K (−196° C.) to 340 K (67° C.).

Figure 7:
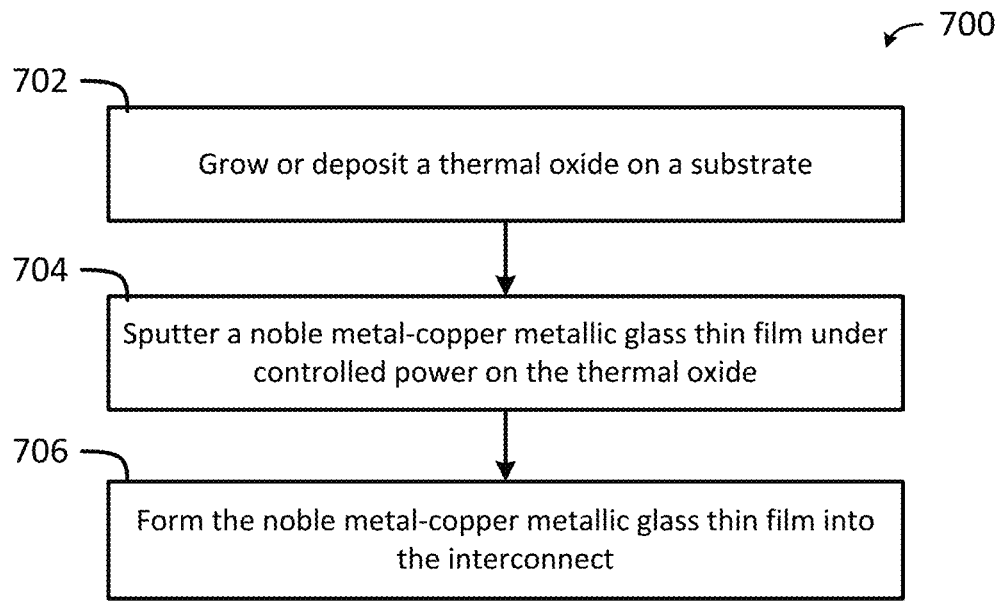
FIG. 7 is a process flow chart of method of making an interconnect between one or more features on a substrate in accordance with one embodiment of the present invention.

FIG. 7 is a process flow chart of method 700 of making an interconnect between one or more features on a substrate in accordance with one embodiment of the present invention. A thermal oxides is grown or deposited on the substrate in block 702. A noble metal-copper metallic glass thin film is sputtered under controlled power on the thermal oxide in block 704, The noble metal-copper metallic glass thin film is formed into the interconnect in block 706. In one aspect, the noble metal is selected from at least one of ruthenium, rhodium, palladium, silver, osmium, iridium, platinum, or gold. In another aspect, the sputtering step further comprises using a temperature gradient assist. In another aspect, the noble metal-copper metallic glass thin film is a eutectic that comprises between 20, 30, 40, 50, 60, and 70 atomic % (at %) noble metal and the remainder Cu. In another aspect, the noble metal-copper metallic glass thin film is a eutectic that comprises between 20, 30, 40, 50, 60, and 70 at % Cu and the remainder the noble metal. In another aspect, the deposition rate of the sputtering step is 0.5, 0.6, 0.7, 0.8, 0.9, 1.0, 1.1, 1.2, 1.3, 1.4, 1.5, 1.6, 1.7, 1.8, 1.9, or 2.0 Å/s. In another aspect, the controlled power is defined further as a low power sputtering at about 20, 30, 40, 50, 60, 70, 80 or 90 watts. In another aspect, the controlled power is a low power sputtering using a DC magnetron. In another aspect, a base pressure and a deposition pressure during the sputtering step is between ~10-7 Torr and ~10-3 Torr. In another aspect, a temperature of the substrate temperature is maintained at about 12, 13, 14, 15, 16, 17, 18, 19, 20, 21, 22, 23, 24, or 25° C. In another aspect, the substrate is a silicon substrate. In another aspect, the interconnect shows little to no change in resistivity in a temperature range of 77K to 340K. In another aspect, a resistivity of the Au or Ag-copper eutectic thin film is generally independent of temperature.

Figure 8:
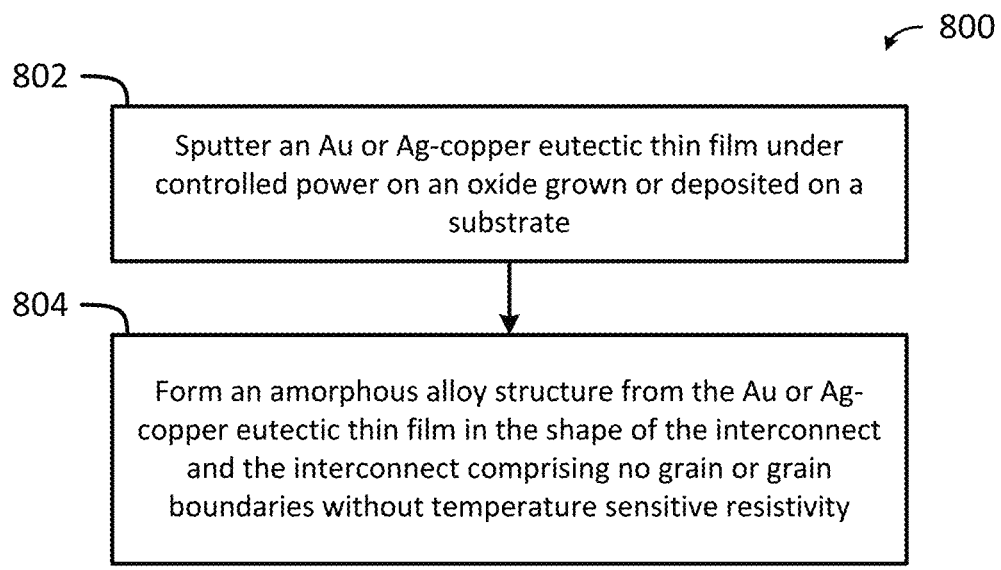
FIG. 8 is a process flow chart of method of making an interconnect between one or more features on a substrate in accordance with another embodiment of the present invention.

FIG. 8 is a process flow chart of method 800 of making an interconnect between one or more features on a substrate in accordance with another embodiment of the present invention. An Au or Ag-copper eutectic thin film is sputtered under controlled power on an oxide grown or deposited on a substrate in block 802. An amorphous alloy structure is formed from the Au or Ag-copper eutectic thin film in the shape of the interconnect and the interconnect comprising no grain or grain boundaries without temperature sensitive resistivity in block 802. In one aspect, a resistivity of the Au or Ag-copper eutectic thin film is generally independent of temperature.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), propertie(s), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

1. T. Homma, Materials Science & Engineering R-Reports 23 (6), 243 (1998).
2. Debra Vogler, in www.electroiq.com/blog/2014/05/down-to-5 nm-scaling-with-the-usual-suspects-performance-cost (Solid State Technology, Insights for Electronics Manufacturing, USA, 2014); Xiangyu Chen, Jiale and Liang, and H.-S. Philip Wong, presented at the System Level Interconnect Prediction, 2012, Moscone Center, San Francisco, Calif., USA, 2012 (unpublished).
3. J. Chawla, F. Gstrein, K. O'Brien, J. Clarke, and D. Gall, Physical Review B 84 (23), 235423 (2011).
4. Tae-Hwan Kim, X. G. Zhang, Don M. Nicholson, Boyd M. Evans, Nagraj S.
Kulkarni, B. Radhakrishnan, Edward A. Kenik, and An-Ping Li, Nano Letters 10 (8), 3096 (2010).
5. Sayantan Das, Rajitha N. P. Vemuri, and T. L. Alford, Journal of Vacuum Science & Technology B 31 (1) (2013).
6. Daniel Adams, Terry L. Alford, and James W. Mayer, in Silver Metallization (Springer London, 2008), pp. 75.
7. B. Z. Li, T. D. Sullivan, T. C. Lee, and D. Badami, Microelectronics Reliability 44 (3), 365 (2004); E. T. Ogawa, K. D. Lee, V. A. Blaschke, and P. S. Ho, Ieee Transactions on Reliability 51 (4), 403 (2002).
8. E. Misra and T. L. Alford, Applied Physics Letters 87 (17) (2005).
9. J. Homoth, M. Wenderoth, T. Druga, L. Winking, R. G. Ulbrich, C. A. Bobisch, B. Weyers, A. Bannani, E. Zubkov, A. M. Bernhart, M. R. Kaspers, and R. Möller, Nano Letters 9 (4), 1588 (2009).

10. Seunghun Lee, Ji Young Kim, Tae-Woo Lee, Won-Kyung Kim, Bum-Su Kim, Ji Hun Park, Jong-Seong Bae, Yong Chan Cho, Jungdae Kim, Min-Wook Oh, Cheol Seong Hwang, and Se-Young Jeong, Scientific Reports 4 (2014).
11. Sang Mo Yang, Evgheni Strelcov, M. Parans Paranthaman, Alexander Tselev, Tae Won Noh, and Sergei V. Kalinin, Nano Letters 15 (2), 1062 (2015).
12. Darren Davidson Bradley, University of Colorado 2010.
13. Moulder John F., Stickle William F., Peter E. Sobol, and Kenneth D. Bomben, Handbook of X-ray Photoelectron spectroscopy. p. 41.
14. S. Hüfer, G. K. Wertheim, and J. H. Wernick., Phys. Rev. B 8, 4511 (1973).
15. P. Oelhafen, E. Hauser, H. Guntherodt, and K. Bennemann, Phys. Rev. Lett. 43, 1134 (1979).
16. Masanori Ushida, Kazuhide Tanaka, Kenji Sumiyama, and Yoji Nakamura, Journal of the Physical Society of Japan 58 (5), 1725 (1989).
17. Fujime Satoru, Japanese Journal of Applied Physics 5 (7), 643 (1966).

What is claimed is:

1. An integrated circuit interconnect on a substrate comprising:
   an amorphous noble metal-copper metallic alloy glass thin film disposed on the substrate, wherein the amorphous noble metal-copper metallic alloy glass thin film is homogenous with no poly-crystalline heterogeneity; and
   wherein the amorphous noble metal-copper metallic alloy glass thin film comprises 20 to 70 at % copper and a remainder at % noble metal.
2. The interconnect of claim 1, wherein the noble metal is selected from at least one of ruthenium, rhodium, palladium, silver, osmium, iridium, platinum, or gold.
3. The interconnect of claim 1, wherein the interconnect is formed by low power sputtering in a temperature gradient assist.
4. The interconnect of claim 1, wherein the amorphous noble metal-copper metallic alloy glass thin film is an eutectic that comprises 60 to 80 at % noble metal and the remainder at % copper.
5. The interconnect of claim 1, wherein the amorphous noble metal-copper metallic alloy glass thin film is an eutectic.
6. The interconnect of claim 1, wherein the interconnect is formed with a deposition rate is 0.5, 0.6, 0.7, 0.8, 0.9, 1.0, 1.1, 1.2, 1.3, 1.4, 1.5, 1.6, 1.7, 1.8, 1.9, or 2.0 Å/s.
7. The interconnect of claim 1, wherein the interconnect is formed by a low power sputtering at 20, 30, 40, 50, 60, 70, 80 or 90 watts.
8. The interconnect of claim 1, wherein the interconnect is formed by sputtering with a DC magnetron.
9. The interconnect of claim 8, wherein the interconnect is formed with a base pressure and a deposition pressure between ~$10^{-7}$ Torr and ~$10^{-3}$ Torr during sputtering.
10. The interconnect of claim 1, wherein the interconnect comprises a high surface tension and an anatomically smooth surface or small line edge roughness.
11. The interconnect of claim 1, wherein the interconnect produces a uniform electric field across the interconnect.
12. The interconnect of claim 1, wherein the interconnect comprises no grain.
13. The interconnect of claim 1, wherein the interconnect comprises no grain boundaries.
14. The interconnect of claim 1, wherein the interconnect shows little to no change in resistivity in a temperature range of 77K to 340K.
15. The interconnect of claim 1, wherein a resistivity of the amorphous noble metal-copper metallic alloy glass thin film is generally independent of temperature.
16. The interconnect of claim 1, wherein the substrate is a silicon substrate.
17. An integrated circuit interconnect on a substrate comprising:
   an Au or Ag-copper eutectic thin film disposed on the substrate, wherein the Au or Ag-copper eutectic thin film is amorphous and comprises no grain or grain boundaries without temperature sensitive resistivity; and
   wherein the Au or Ag-copper eutectic thin film comprises 20 to 70 at % copper and a remainder at % Au or Ag.
18. The interconnect of claim 17, wherein a resistivity of the Au or Ag-copper eutectic thin film is generally independent of temperature.
19. The interconnect of claim 17, wherein the interconnect comprises a high surface tension and an anatomically smooth surface or small line edge roughness.
20. The interconnect of claim 17, wherein the interconnect produces a uniform electric field across the interconnect.

* * * * *